United States Patent
Deguet et al.

(10) Patent No.: US 7,863,156 B2
(45) Date of Patent: Jan. 4, 2011

(54) METHOD OF PRODUCING A STRAINED LAYER

(75) Inventors: Chrystel Deguet, St Ismier (FR); Frank Fournel, Villard Bonnot (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/410,161

(22) Filed: Mar. 24, 2009

(65) Prior Publication Data
US 2009/0246933 A1 Oct. 1, 2009

(30) Foreign Application Priority Data
Mar. 28, 2008 (FR) .................................. 08 52034

(51) Int. Cl.
*H01L 21/30* (2006.01)
*H01L 21/46* (2006.01)

(52) U.S. Cl. ........................ 438/458; 438/455; 438/457; 257/E21.567

(58) Field of Classification Search .................. 438/455, 438/457, 458; 257/E21.567
See application file for complete search history.

(56) References Cited

U.S. PATENT DOCUMENTS
2003/0199105 A1 10/2003 Kub et al.
2004/0229444 A1 11/2004 Couillard et al.

FOREIGN PATENT DOCUMENTS
| WO | WO 98/54766 | 12/1998 |
| WO | WO 03/030215 | 4/2003 |
| WO | WO 2006/097522 | 9/2006 |

OTHER PUBLICATIONS

"Silicon Wafer Bonding Technology" for VLSI and MEMS Applications, Edited by S.S. Iyer and A. J. Auberton-Hervé, 2002, INSPEC, London, Chapter 1, pp. 1-20.

"Silicon Wafer Bonding Technology" for VLSI and MEMS Applications, Edited by S.S. Iyer and A. J. Auberton-Hervé, 2002, INSPEC, London, Chapter 3, pp. 35-52.

K. Sakaguchi, et al.—"ELTRAN® By Splitting Porous Sl Layers", Proceedings of the 9$^{th}$ International Symposium on Silicon-on-Insulator Tech. and Devicem 99-3, The Electrochemical Society, Seattle, p. 117-121 (1999).

*Primary Examiner*—Alexander G Ghyka
*Assistant Examiner*—Seahvosh J Nikmanesh
(74) *Attorney, Agent, or Firm*—Brinks Hofer Gilson & Lione (57) ABSTRACT

A method of producing a strained layer on a substrate includes assembling a layer with a first structure or first means of straining including at least one substrate or one layer capable of being deformed within a plane thereof under the influence of an electric or magnetic field or a photon flux. The layer is strained by modifying the electric or magnetic field or the photon flux. The strained layer is assembled with a transfer substrate and all or part of the first straining structure is removed.

24 Claims, 5 Drawing Sheets

METHOD OF PRODUCING A STRAINED LAYER

RELATED APPLICATIONS

The present patent document claims the benefit of priority to French Patent Application No. 08 52034, filed Mar. 28, 2008, which is incorporated herein by reference.

TECHNICAL FIELD AND PRIOR ART

This invention relates to methods of producing strained layers, in particular of the type which require adaptation of the unit cell or lattice parameter.

It applies, in particular, to the manufacture of strained layers for microelectronics, such as sSOI (Strained Silicon on Insulator).

sSOI is known to be obtained by growing a layer of $Si_{1-x}Ge_x$ (commonly x=0.2) relaxed on a silicon substrate, by possibly using buffer layers enabling the unit cell parameter to be adapted.

Next, a very fine layer of silicon is grown in order for it to retain the unit cell parameter of the SiGe. In the case of $Si_{0.8}Ge_{0.2}$ the silicon is then strained to approximately 1.4 GPa with a parameter mismatch of 0.7%. This strained Si layer can then be transferred onto an oxidized silicon substrate in order to manufacture an sSOI (Strained Silicon on Insulator).

Other sSOI production techniques exist, however, in general, they make use of epitaxy, which makes these techniques rather expensive. Furthermore, there is always a high rate (greater than $10^4/cm^2$) of dislocations in the strained silicon layer.

DISCLOSURE OF THE INVENTION

The invention relates to a method of creating strain in a layer, for example, made of a semiconductor material, comprising:

a) the assembly of this layer with a first structure or means of straining, comprising at least one substrate or one layer capable of being deformed within the plane thereof under the influence of an electric or magnetic field or a photon flux, b) the straining of said substrate or said layer by modifying the electric or magnetic field or the photon flux applied to the deformable substrate or layer.

The invention makes it possible to do without the heteroepitaxy step, which limits the number of dislocations in the strained layer and loosens the limitations on the choice of materials being strained.

According to the invention, a strained layer is produced by utilizing the piezoelectric or electrostrictive or magnetostrictive or photostrictive properties of the substrate or of the layer of deformable material.

In the case of a structure for straining with a piezoelectric or electrostrictive material, two electrodes are arranged on both sides of the substrate or piezoelectric or electrostrictive layer.

Modification of the electric or magnetic field or photon flux applied to the substrate or to the deformable layer may consist of an increase (or even the creation) or a reduction (or even the elimination) or the reversal of said field or said flux applied.

The layer being strained can initially be part of a substrate. This substrate is assembled with the first straining structure, during step a).

The layer is then individualized or separated from the rest of the substrate for example, by a mechanical-type thinning operation, or by fracturing of the substrate along an embrittlement region produced in this substrate (for example, via implantation of gas species).

Alternatively, the original substrate can comprise an embedded etch-stop layer. In this case, thinning of the original substrate is of the mechanical and/or chemical type and is carried out until this stop layer is attained, which is then eliminated chemically in order to leave the layer being strained remaining.

A method according to the invention can comprise:

prior to step a), pre-straining, via straining of the first straining structure, with a prestrain having an opposite sign of that to be applied to the layer being strained or to be strained, after step a), relaxation of the pre-strain, in order to strain the layer to be strained.

Preliminary straining of the substrate or deformable layer makes it possible to generate or increase the strain of the layer being strained or to be strained.

An additional strain can then advantageously be applied to the layer thus strained, by modifying the electric or magnetic field or the photon flux applied to the deformable layer.

The strained layer may advantageously be assembled together with a substrate or transfer layer. Throughout the text, the two expressions "substrate" and "layer" are used equally, regardless of the thickness of the element concerned.

It is thus possible to strain a layer prior to assembly with a final substrate.

It is thus possible, for example, to produce an sSOI-type substrate.

An assembly step can be of the molecular bonding type, however other types of bonding are possible (for example, using a glue or a polymer).

After the strained layer has been bonded to the transfer substrate, the straining structure can be completely or partially removed.

The energy for assembling said layer to be strained with the straining layer is less than the energy for assembling the strained layer with the transfer substrate. The thin layer can thus be easily detached during the transfer onto the transfer substrate.

The second substrate can be or form part of a second straining structure. After assembly with the transfer substrate, it is then possible to carry out an additional straining of said strained layer via the first one or via this second straining structure.

Alternatively, after the step of assembly with the second substrate, a method according to the invention can next comprise:

a') an assembly of the strained layer from the transfer substrate towards the first one or towards a second straining structure, b') an additional straining of said strained layer via the first one or via this second straining structure.

During step a', the assembly of the strained layer can consist of a first assembly of the strained layer with a temporary handle, and then a second assembly of the strained layer on the straining structure. In this case, the straining structure can be the one already used in steps a) and b).

More generally speaking, a method according to the invention can comprise:

a') an assembly of the strained layer, after a first straining by applying steps a) and b), from the first straining structure towards a second straining structure, b') an additional straining of said strained layer via this second straining structure.

Here again, there may be an assembly of said strained layer onto another assembly substrate.

The second straining structure can comprise at least one substrate or one layer capable of being deformed within the plane thereof, under the influence of an electric or magnetic field or a photon flux. In the case of step b'), the latter can then comprise the straining of said layer via modification of the electric or magnetic field or the photon flux applied to the deformable substrate or to the deformable layer of the second straining structure.

In this way, regardless of the embodiment of the method according to the invention, this method can be repeated.

The substrate or the deformable layer can be thick, typically having a thickness greater than 200 micrometers or between 200 μm and 500 μm or 1 μm.

It can likewise consist of a thin layer having a thickness less than 200 micrometers, or even less than 50 micrometers or between 1 μm and 50 μm or 200 μm.

The straining structure (comprising the deformable layer) can likewise comprise films facilitating the bonding of the layer to be strained and/or the application of the strain to the deformable layer.

Molecular bonding of the layer to be strained with the straining structure can be carried out directly on the deformable layer or on an electrode.

Alternatively, in order to facilitate molecular bonding and/or application of the strain, a film can be arranged on the deformable layer or on the electrode and/or on the layer to be strained: this film, for example, is a dielectric layer (of nitride or silicon oxide, for example).

An intermediate layer, for example, a thick layer of $SiO_2$ or Ge, or $Si_3N_4$ or $HFO_2$, can be formed on an electrode with which, or on the substrate or the layer with which the layer to be strained is assembled. The intermediate layer can have a roughness on the face thereof which is intended to be assembled with the layer to be strained.

DETAILED DESCRIPTION OF PARTICULAR EMBODIMENTS

A method according to the invention implements a substrate made of a piezoelectric or electrostrictive or magnetostrictive or photostrictive material. The invention will be described below in the case of a piezoelectric substrate.

Subsequently, reference will be made to the "Smart Cut™" substrate fracture method. This method is described, for example, in the article by B. Aspar and A. J. Auberton-Hervé "Silicon Wafer Bonding Technology for VLSI and MEMS applications", edited by S. S. Iyer and A. J. Auberton-Hervé, 2002, INSPEC, London, Chapter 3, pages 35-52.

Subsequently, reference will likewise be made to molecular bonding, which is also called direct bonding. This will be the case more specifically for assembling the substrate from which the layer being strained results and the straining structure. This assembly technique is described in particular by Q. Y. Tong in "Silicon Wafer Bonding Technology for VLSI and MEMS applications", Edited by S. S. Iyer et A. J. Auberton-Hervé, 2002, INSPEC, London, Chapter 1, pages 1-20.

Prior to an assembly such as this, steps for preparing the surfaces being assembled can be carried out, such as the deposition of bonding layers and/or polishing and/or cleaning and/or plasma processing, in order to enable bonding with controlled bonding energy (strong or weak, depending on circumstances).

The faces being bonded can be planarized and prepared for molecular bonding, in particular in order to make them hydrophilic or hydrophobic.

A heat treatment can next be applied for the purpose of increasing the bonding energy. Depending on the nature of the substrates present, the heat treatment can be carried out at between 20° C. and 1200° C. for a few tens of minutes to a few hours, depending likewise on the compatibility of the layers.

Figure 1A:
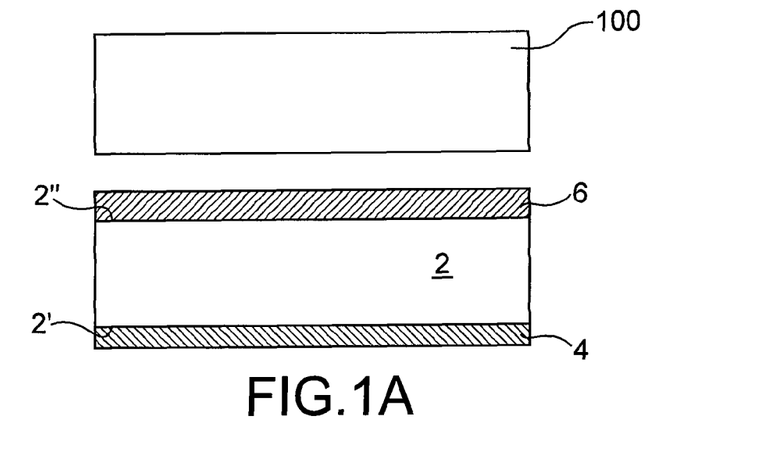
FIGS. 1A to 1C show a method of assembling a layer to be strained on a substrate containing a piezoelectric material, in accordance with an embodiment of the invention.

In a first embodiment shown in FIG. 1A, a structure is produced which comprises a substrate 2 made of a piezoelectric material having two faces 2', 2" and which is provided on each of these faces with a metal electrode 4, 6. The piezoelectric material, for example, is chosen from among berlinite (AlPO4), zinc oxide (ZnO), quartz, topaz, gallium orthophosphate (crystal GaPO4), langasite (La3Ga5SiO14), barium titanate (crystal BaTiO3), or lead titanate (PbTiO3), or lead zirconate titanate (Pb(ZrTi)O3) (PZT), or potassium niobate (KNbO3), or lithium niobate(LiNbO3), or lithium tantalate (LiTaO3), or sodium tungstate (NaxWO3), or Ba2NaNb5O5, or Pb2KNb5O15.

An initial substrate 100 is placed into contact and assembled, for example, by molecular bonding, with the free surface of one of the two electrodes associated with the piezoelectric material, in this case electrode 6, either directly or by means of a bonding layer, for example, a thin layer of $SiO_2$ or $Si_3N_4$.

Figure 1B:
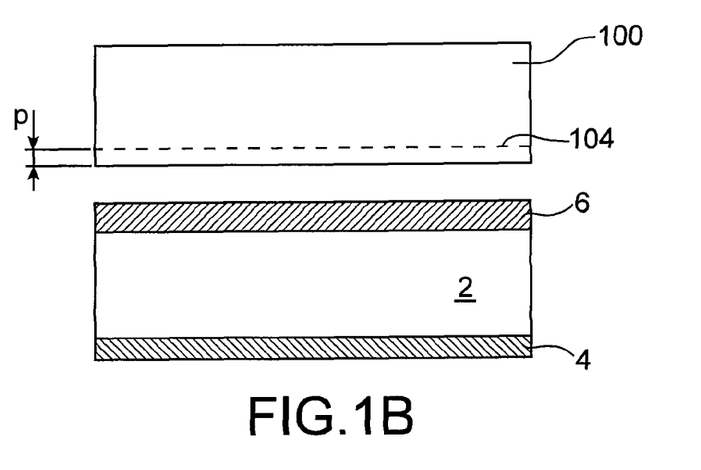
Figure 1C:
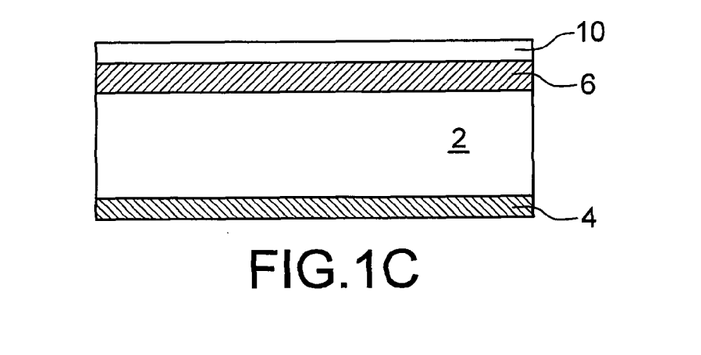

After this assembly, the substrate 100 is thinned out, for example, via mechanical-chemical polishing. A layer 10 of the substrate material 100 is then obtained, which is transferred onto this same electrode 6 (FIG. 1C).

Alternatively (FIG. 1B), the thinning out can be obtained by fracturing along a fragile embedded region of the substrate 100, for example, a porous region or a region obtained by implanting one or more gas species (Smart Cut™ technology). The obtainment of a porous layer is described, for example, in the article by K. Sataguchi et al. "ELTRAN® by Splitting Porous Si layers", Proceedings of the 9th International Symposium on Silicon-on-Insulator Tech. and Device, 99-3, The Electrochemical Society, Seattle, p. 117-121 (1999).

In the case of implantation, the substrate 100 (possibly covered with a dielectric layer, for example, with $SiO_2$) is pre-implanted with ions and/or atoms, to an average depth p close to the depth desired for the thin layer 10 of material being transferred. An embrittlement region 104 is thus formed. After assembly with the free surface of the electrode 6, fracturing is carried out, for example, via thermal or mechanical effect, at the level of this embrittlement region 104, in order to leave a thin layer 10 of the substrate material 100 remaining on the electrode 6.

Figure 8A:
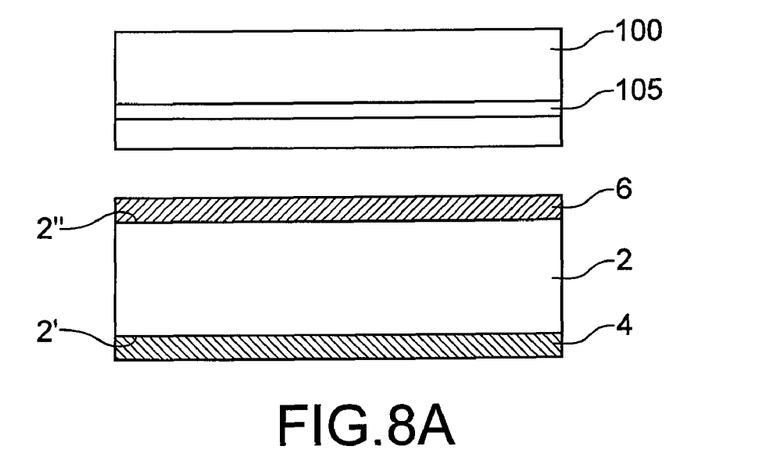
FIGS. 8A-8C show a method of assembling a layer being strained derived from a substrate having a stop layer, in accordance with an embodiment of the invention.
Figure 8B:
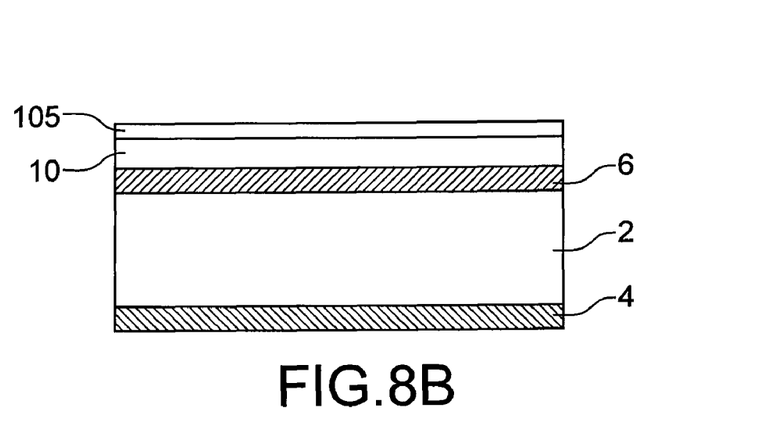
Figure 8C:
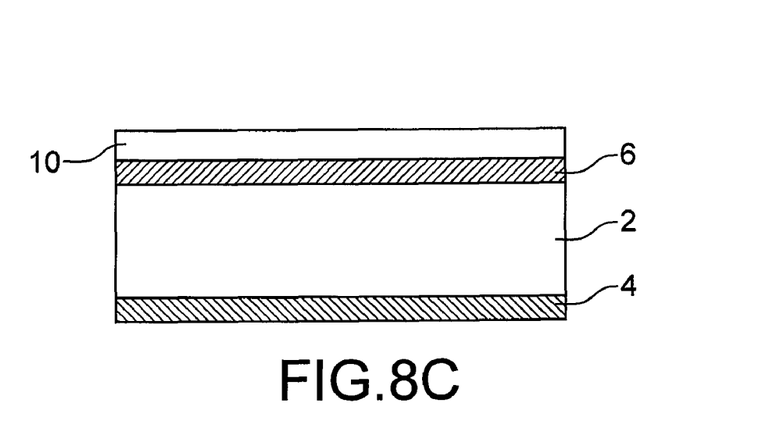

As a further alternative, the original substrate 100 can comprise (FIG. 8A) an embedded stop layer 105: after assembly via molecular bonding with the free surface of one of the two electrodes associated with the piezoelectric material, the substrate is first thinned out mechanically, then chemically, until this stop layer 105 (FIG. 8B) is reached. The latter is next chemically removed selectively with respect to the layer being strained 10 (FIG. 8C). This stop layer, for example, can be the thin layer of oxide of an SOI substrate, while the silicon surface film comprises the layer being strained.

In the three cases described above, a fine layer 10 of the material to be strained is assembled with one of the electrodes associated with the piezoelectric material, which, in this case, is electrode 6. This assembly is preferably carried out by molecular bonding, however other types of bonding are possible (for example, using a glue or a polymer). The assembly or bonding has a degree of energy sufficiently strong to ensure the integrity of the assembly or bond during straining of the film 10.

The assembly or bonding energy can be provided such that layer 10 can subsequently be easily detached at the level of this assembly or bonding interface.

Alternatively, an intermediate layer, for example, a thick layer made of SiO2, or Ge, or Si3N4, or HfO2 can be provided between the layer 10 of material being strained and the electrode 6, in order to facilitate the later detachment of this layer and this electrode, for example, by selective etching.

Figure 2:
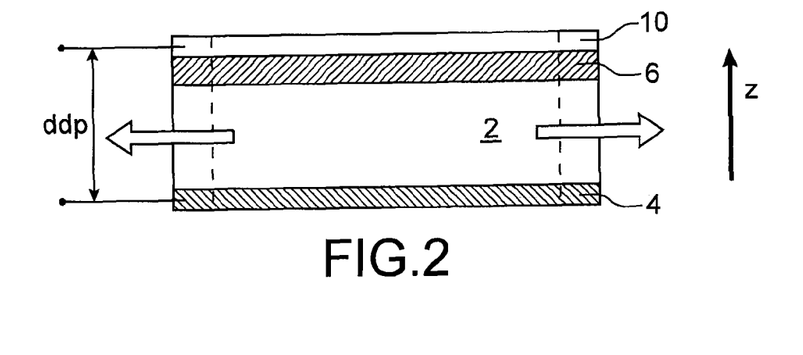
FIG. 2 shows a layer to be strained on a substrate containing a piezoelectric material on which a potential difference is applied, thereby inducing deformation of the material within the plane thereof and therefore of the layer being strained, in accordance with an embodiment of the invention.

FIG. 2 shows the effect obtained on the assembly of FIG. 1C when a potential difference is applied along the Z-axis, by means of the two electrodes 4, 6. The voltage applied makes it possible to produce a deformation of the piezoelectric material 2 within the plane thereof, based on the potential difference applied, which, in the example, results in layer 10 being stressed.

Figure 3:
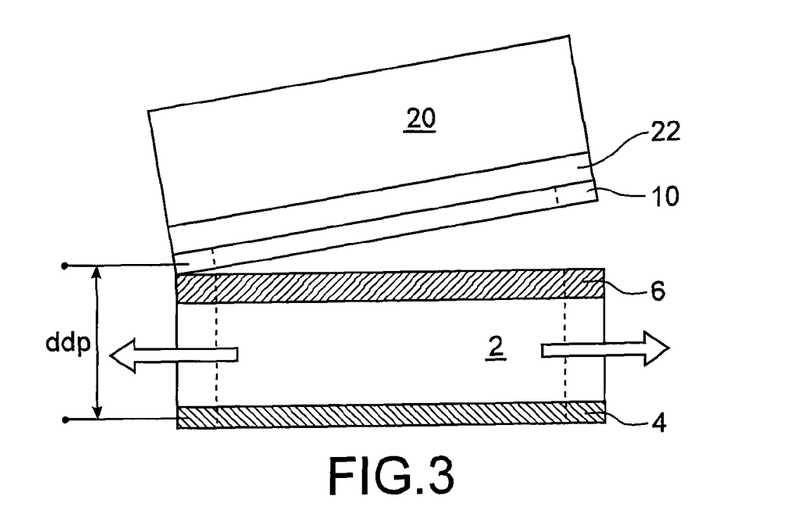
FIG. 3 shows a step of transferring a strained layer onto a transfer substrate, in accordance with an embodiment of the invention.

The latter can then be assembled, for example, via molecular bonding, with a transfer substrate 20 (FIG. 3). Layer 10 can be assembled directly to the substrate 20, or else by means of a layer 22, for example, of oxide, as shown in FIG. 3 or by means of a glue.

After this assembly, the structure (comprising at least the piezoelectric substrate and the two electrodes thereof) can be at least partially removed (for example, by being detached at the interface level between the structure and layer 10).

The potential difference applied to the piezoelectric substrate 2 by means of the electrodes 4, 6 can be maintained during the entire process of transferring layer 10 onto the final substrate 20. Alternatively, it can be applied only during the step of assembling with the final substrate. In this way, a layer 10 of material is obtained, which is assembled with host substrate and which has strain. For example, if one considers a silicon host substrate 20, provided with a silicon oxide layer 22 (which may have been obtained via surface oxidation of the substrate 20), the transfer of a strained thin film of silicon makes it possible to obtain an sSOI-type substrate.

It is thus possible to obtain a strained thin film 10 after a single straining operation on a substrate 2 made of a piezoelectric material and after a single assembly with the substrate 20.

However, it is likewise possible to repeat the method, by once again assembling layer 10 of the substrate 20 with a straining structure, in the same way as during the first straining operation, or with a different structure comprising another layer made of a material capable of being deformed within the plane thereof under the influence of an electric or magnetic field or else a photon flux (these deformation modes will be described later on).

Alternatively, the strained layer 10 could be transferred directly from the first straining structure to a second straining structure. This second straining structure can be of the type of one of the structures according to this invention, such as those already described above or those described below. In particular, this second straining structure can be similar or identical to the first structure.

The first strain value, obtained during the first cycle, is then increased, for example, in order to attain a second value which is greater than the first value. A cycle such as this can be repeated any number of times, in order to reach any desired strain state.

This repetition of the method may or may not be combined with the application of a pre-strain or pre-deformation, as will be explained in greater detail below, by applying a preliminary deformation to layer 2, which is opposite the opposite of that to be applied to the layer of material being strained.

In this way, when the invention is repeated, the second piezoelectric or electrostrictive or magnetostrictive or photostrictive material can be pre-deformed prior to assembly with the material being strained, this pre-deformation being the opposite of that to which the material being strained is to be subjected. Once the layer being strained has been transferred, the stress is relaxed, which already strains the material being strained a second time. Next, the reverse stress can be applied, which strains the material being strained a third time.

For example, in the case of piezoelectric materials, a field of 20 MV/m is applied to the terminals of the electrodes of a structure comprising a PZT substrate with a piezoelectric coefficient $d_{3,1}$ of 200 pm/V, onto which a thin silicon film was transferred. This strains this film to 0.4%. A second structure is then taken, comprising a massive PZT material subjected to a field of −20 MV/m, and then the silicon film is transferred onto an electrode associated with this second PZT substrate. The voltage is shut off, which dilates this second structure and thereby further increases the unit cell parameter of the silicon by 0.4%. Next, a field of 20 MV/m is applied, which further increases the unit cell parameter of the silicon by 0.4%. The silicon is then transferred onto the oxidized silicon substrate, and an sSOI is thus obtained which has a unit cell parameter under stress of 1.2%.

Generally speaking, the deformation of the piezoelectric material 2 is given by the following relationship:

$$\Delta L \approx E d_{i,j} L_0$$

where $d_{i,j}$ is the piezoelectric coefficient of the material, E the field applied in $Vm^{-1}$ and $L_0$ the initial deformation.

Deformation can be calculated under the following conditions: a substrate 2 is taken into account, having a thickness of 500 µm, which is made of a PZT piezoelectric material with a coefficient $d_{3,1}$ of the order of 200 pm/V, and a voltage of 10,000 V is applied between the two electrodes 4, 6 of the PZT material substrate.

The electric field is 20 MV/m. This value is lower than the breakdown voltage of the PZT, which is greater than 63 MV/m.

This results in a deformation of the order of 0.4% which, in the known technique with regard to SiGe, corresponds substantially to the equivalent of an sSi on SiGe (with 20% Ge).

According to another exemplary embodiment, the piezoelectric material is quartz.

A substrate 2 is thus taken into account, having a diameter of 200 mm and a thickness of 500 micrometers. The two electrodes 4, 6 are next made by depositing a conductive material (for example, made of Au, or of a conductive oxide) onto both faces of the quartz substrate. An oxide is likewise deposited. For example, 500 nm of SiO2 are deposited via PECVD (plasma-enhanced chemical vapour deposition). An oxide deposition temperature is chosen which is not too high to guarantee the integrity of the electrodes.

The oxide may be optionally roughened slightly (via chemical or plasma processing), in order to produce a detachable bond.

The layer 10 to be strained, which is made of silicon, for example, and possibly covered with a thin layer of oxide, for example, thermal oxide, is next assembled with this oxide layer. For example, starting with an SOI substrate, the silicon surface layer of this SOI, possibly covered with a thin layer of oxide, is assembled and bonded with the oxide layer deposited onto the electrode. This SOI substrate is then thinned out, in order to leave only the silicon layer on an oxide layer on the electrode of the piezoelectric substrate.

Optionally, a thinning out of the transferred or assembled layer may be carried out.

Once the layer 10 of silicon Si, for example, having a thickness of 20 nm, or typically between 5 nm and 100 mn, has been thus assembled with the oxide layer, voltage is applied between the two electrodes 4, 6, which has the effect of placing this silicon layer 10 under stress.

The coefficient $d_{3.1}$ in this case is of the order of 3 pm/V, and a voltage of 4000 V is applied to the terminals of the material 2 (between the two electrodes 4, 6).

This results in an electric field of 8 MV/m (very close to the breakdown voltage limit in quartz), and a deformation of the order of 0.002%.

The resulting deformation value is low. However, quartz has the advantage of being a massive material available in 200 nm. Furthermore, as already explained above, it is possible to repeat the straining cycle, in order to increasingly strain the silicon.

Finally, the stressed silicon is assembled with a surface-oxidized silicon substrate 20 in order to obtain an SOI structure, with a strained silicon surface layer.

Prior to assembling or bonding the layer 10 being strained or to be strained with the piezoelectric material, it is advantageously possible to carry out a pre-deformation of layer 2, by applying thereto a deformation which is opposite that which one wishes to apply to the material being strained or to be strained. After assembly of layer 10 with the piezoelectric material, the strain on the latter is completely or partially relaxed, by canceling or modifying the stress applied. Layer 10 is then strained. The layer thus strained can be assembled with a final or transfer substrate.

Alternatively, layer 2 can once again be deformed, by applying a deformation thereto which is of the same sign as that which one wishes to apply to the material being strained, in order to further increase the strain on this material.

In general, during stressing, the air breakdown voltage, which is of the order of 3 MV/m, does not pose any problem. However, if this were not the case, it would not be possible to increase the value of the air breakdown voltage by modifying the pressure thereof, or by modifying the nature of the gas comprising the surrounding atmosphere, or by placing the system under a vacuum.

The embodiment of the invention described above has disadvantages. It implements a massive piezoelectric material 2 and requires the application of relatively high voltages. According to another embodiment of the method, therefore, a massive substrate is not used, but rather one or more thin layers of a piezoelectric material, which is (are) obtained, for example, via deposition or transfer onto a supporting substrate. A thin layer such as this, or a set of thin layers, for example, is of a thickness less than 200 μm or between 1 μm and 100 μm.

This layer can be deposited on a supporting substrate in order to form the structure onto which the layer being strained is bonded. In this case, a sufficiently flexible supporting substrate is chosen, in order to enable the deformable layer to be deformed. If necessary, an intermediate layer may be provided for this purpose.

Figure 4:
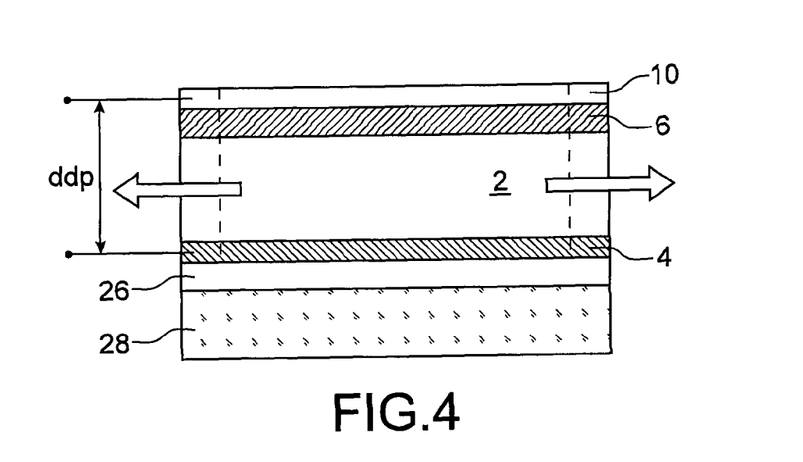
FIG. 4 shows a layer being strained on a layer of energized piezoelectric material, in accordance with an embodiment of the invention.

The piezoelectric material, with its stack of electrodes 4, 6, is deposited or transferred onto a ductile layer or supporting substrate 26, for example, of the polymer type (in particular, this can be PDMS or polyvinylidene fluoride (PVDF)) so as to enable deformation of the piezoelectric material and therefore straining of the upper layer 10. This ductile layer enables the piezoelectric material to be deformed. Reference 28 designates a supporting substrate.

In this case, the orders of magnitude of the strain are as follows.

Deformation of the piezoelectric material is given by the same formula as the one already indicated above. The same PZT material is taken into account, with the same coefficient $d_{3.1}$ of the order of 200 pm/V.

For an applied voltage of 4000 V on both sides of a layer 2 having a thickness of 100 μm, there is an electric field of 40 MV/m.

This results in a deformation of the order of 0.8%, which corresponds substantially to the equivalent of an sSi on SiGe with 20% Ge.

This strain value can be modulated either by the thickness of the layer 2 of piezoelectric material, or by the voltage applied. It is likewise possible to choose another piezoelectric material having another coefficient $d_{3.1}$.

Consequently, according to this embodiment, a massive piezoelectric material substrate is not implemented, but rather a thin layer of such a material, having a thickness, for example, of between 1 μm and 100 μm.

A thin layer of piezoelectric material such as this is advantageously implemented, and the final receiving substrate 20 is thick (for example, having a thickness of between 100 μm and 1 μm) so as to not break if the voltage is relaxed after the last bonding operation.

The fact of placing the thin piezoelectric material under strain may assist in detaching the strained film by applying a mechanical strain at the bonding interface with this film, when the voltage is shut off and therefore the strain of the thin piezoelectric material is relaxed.

Each of the following examples relates to the implementation of the embodiment with not a massive substrate but a fine layer, for example, of a piezoelectric material having a thickness of 10 μm.

In a first exemplary embodiment, quartz is used, a piezoelectric material having the advantage of being available in 200 mm. The initial structure is that of FIG. 4.

Layer 26 is obtained via deposition of PDMS (with a densification anneal for example, at 200° C. for 2 hours), and the substrate 28 is made of silicon. The electrodes 4, 6 result from deposition of a conductive material (for example, made of Au, or a conductive oxide).

The quartz is next thinned out, for example, by lapping and polishing, to a thickness of 10 μm. A low-temperature deposition of a metallic material (for example, <200° C.) is next carried out in order to form the second electrode. The latter is optionally covered with oxide, at a low temperature (for example, a deposit of $SiO_2$ at a temperature <200° C.).

Optionally, the oxide may be roughened slightly (via chemical or plasma processing), so as to produce a detachable bond.

Figure 5:
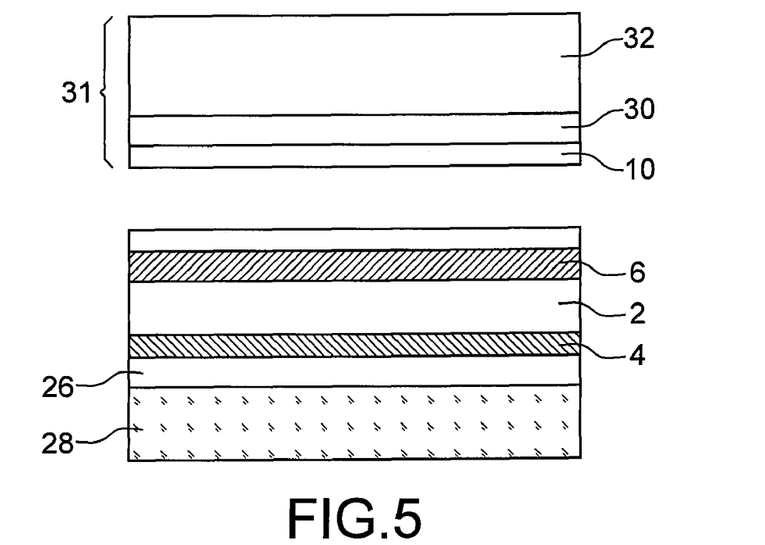
FIGS. 5-7 shows steps for carrying out a method according an embodiment to the invention.

The layer to be strained (made of silicon, for example) is next transferred onto this oxide. To accomplish this, it is possible to start with an SOI 31 (FIG. 5) and to then transfer a layer 10 of silicon via bonding/thinning out. It is also possible to start with a massive substrate, and to then proceed with bonding and thinning out, or with the Smart Cut™ method, if the temperatures enabling this type of thinning out are compatible with the polymer layers.

Figure 6:
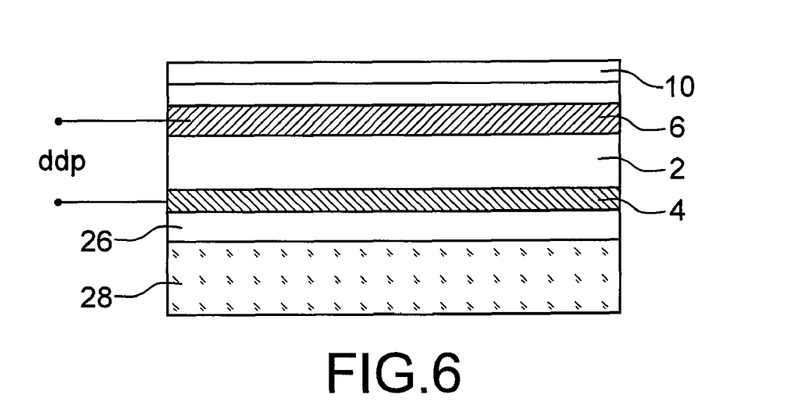

In every case, the structure of FIG. 6 is obtained.

Once the surface of the Si layer has been thinned out (for example, to 20 nm, if starting with an SOI), voltage is applied between the two electrodes, which has the effect of stressing the Si layer.

The coefficient $d_{3,1}$ for quartz is of the order of 3 pm/V, and a voltage of 80 V is applied between the electrodes 4, 6, at the terminals of the material 2 having a thickness of 10 µm. This results in an electric field of 8 MV/m, and a deformation of the order of 0.002%. This corresponds to a stress obtained with SiGe, with a concentration of Ge of the order of 20%.

Figure 7:
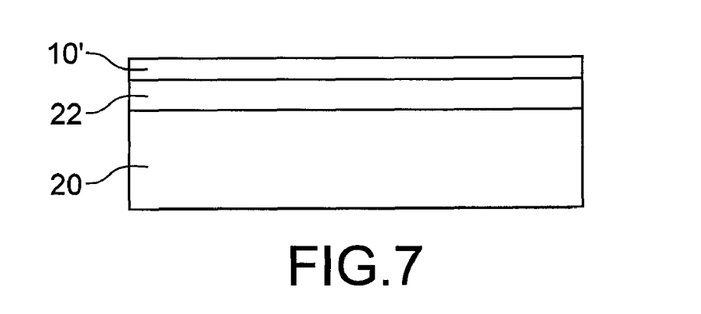

This stressed layer of Si is next transferred onto an oxidized silicon substrate 20, while at the same time maintaining the stress, in order to obtain an sSOI (FIG. 7).

The bonding-straining-stripping operations may optionally be carried out several times, if it is desirable to increase the strain, as already explained above.

In a second exemplary embodiment, PZT is used as the piezoelectric material. The steps described above for the preceding exemplary embodiment are repeated, except for the formation of layer 2, which is obtained via deposition of PZT to a thickness of 10 µm.

Here again, the oxide may optionally be rendered slightly rough (via chemical or plasma processing), so as to produce a detachable bond.

The layer to be strained (made of silicon, for example) is next assembled with this oxide. To accomplish this, here also it is possible to start with an SOI 30 (FIG. 5) or with a massive substrate, by implementing one of the techniques mentioned in the preceding example.

In every case, the structure of FIG. 6 is obtained.

The layer of Si is next strained. The coefficient $d_{3,1}$ for PZT is of the order of 200 pm/V, and a voltage of 400 V is applied between the electrodes 4, 6, at the terminals of the material 2 having a thickness of 10 µm. This results in an electric field of 40 MV/m, and a deformation of the order of 0.8%. This roughly corresponds to a strain obtained in a sSi film with SiGe at a Ge concentration of the order of 20%.

The stressed Si can next be assembled with an oxidized Si substrate 20, for example, while at the same time maintaining the stress, in order to obtain an sSOI (FIG. 7).

The bonding-straining-stripping operations may optionally be carried out several times, if it is desirable to increase the strain, as already explained above.

The examples described above relate to a layer of piezoelectric material, which is capable of being deformed under the influence of an electric field.

The same description applies for a layer of electrostrictive material, likewise becoming deformed under the influence of an electric field. The latter is applied via two electrodes situated on both sides of the layer of electrostrictive material. The straining structure is therefore identical or similar to the one already described above. The embodiment with a thin layer, which was already described above, remains valid for this type of material. The ranges of thicknesses are still valid: a thin layer such as this, or a set of thin layers, is, for example, of a thickness less than 200 µm or between 1 µm and 100 µm.

One straining method is identical or similar to one of those already described above.

Layer 10 is assembled, for example, via molecular bonding, with an electrode of the substrate or layer of electrostrictive material, in one of the ways described above in connection with FIGS. 1A, 1B, 5-6, 8A-8C.

The following materials can be cited as examples of an electrostrictive material:
- compounds of the lead-magnesium niobate (PMN) type,
- compounds of the lead-magnesium and lead titanate (PMN-PT) type,
- compounds of the lead-magnesium-zirconium titanate (PLZT) type.

The invention and all of the alternatives thereof described above also apply to a layer made of a magnetostrictive material.

In this case, electrodes do not have to be provided for the application of an electric field. This time, it is the application of a magnetic field which in turn results in the straining of the assembled layer. Among magnetostrictive materials, reference can be made to cobalt and TerFeNol-D) (Ter for terbium, Fe for iron, NOL for Naval Ordnance Laboratory, D for dysprosium), of formula $Tb_xDy_{1-x}Fe_2$.

Figure 9:
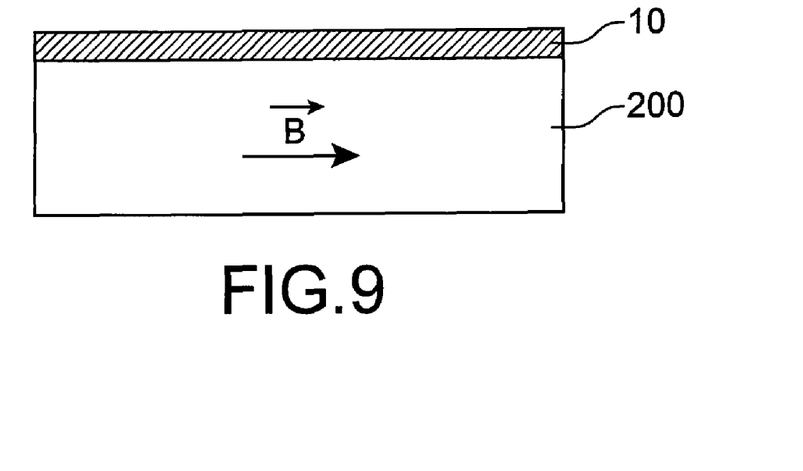
FIGS. 9 and 10 show other embodiments of a method according to the invention.

FIG. 9 shows assembly, for example, via molecular bonding, of a layer 200 of a magnetostrictive material and a layer 10 being strained. The latter can be obtained in one of the ways described above in connection with FIGS. 1A, 1B, 5-6, 8A-8C. A magnetic field B is applied with the aid of means for generating such a field. These means are not shown in the figure. The interaction of this field B with the material of layer 200 deforms the latter. The embodiment with a thin layer, which was already described above, remains valid for this type of material. The ranges of thicknesses are still valid: a thin layer such as this or a set of thin layers, is, for example, of a thickness less than 200 µm or between 1 µm and 100 µm.

According to one exemplary embodiment, the magnetostrictive material Terfelon-D (Tb0.3Dy0.7Fe1.9).

Consideration is thus given to a substrate 2 made of Terfelon-D, which is 200 mm in diameter and 500-µm thick. An oxide is optionally deposited onto this substrate in order to serve as a bonding layer. The oxide can be roughened slightly (via chemical or plasma processing) so as to produce a detachable bond.

The layer to be strained, which is made of silicon, for example, is next assembled with this oxide layer. For example, starting with an SOI substrate, the silicon surface layer of this SOI is assembled and bonded with the oxide layer. This SOI substrate is then thinned out, in order to leave only the silicon layer (and possibly the oxide layer) on the oxide layer of the magnetostrictive substrate.

Optionally, a thinning out of the transferred layer may be carried out.

Once the layer of silicon Si, having a thickness of 20 nm, for example, (between 5 nm and 100 nm, and preferably approximately 20 nm) has been assembled with the oxide layer, a magnetic field (perpendicular to the Terfelon-D wafer) is applied to the entire structure, which has the effect of contracting the Terfelon-D within the plane of the wafer, and therefore has the effect of placing the silicon layer under compressive stress. With an $\Delta L/L$ of $5.10^{-4}$ a deformation of 0.05% is obtained.

It is possible to repeat this operation and/or to likewise pre-strain the magnetostrictive material prior to molecular bonding.

Figure 10:
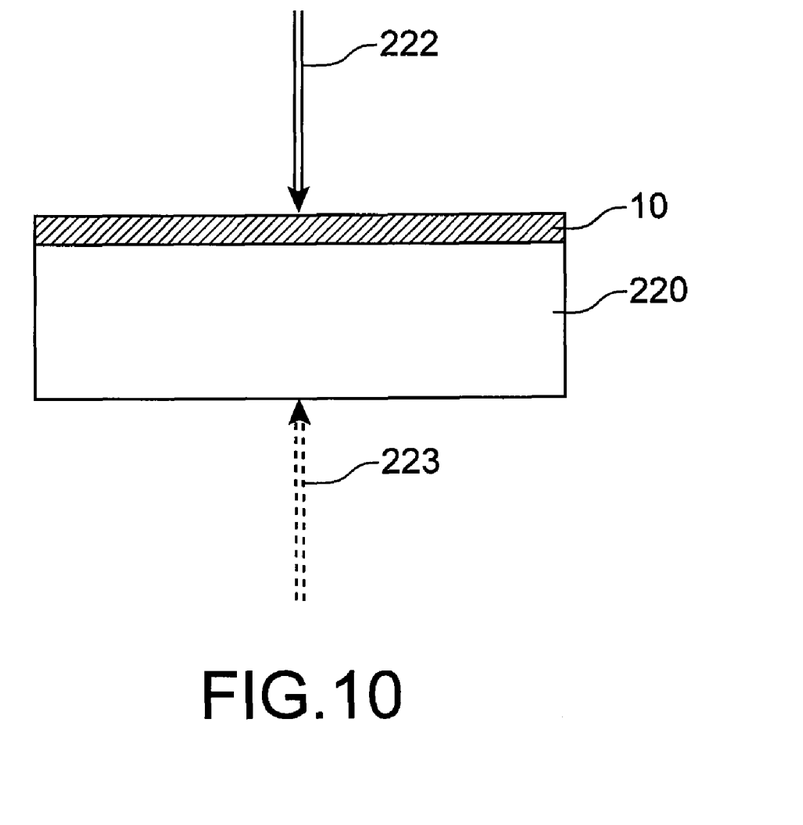

The invention and all of the alternatives thereof described above also apply to a layer 220 made of a photostrictive material, as shown in FIG. 10.

In this case also, electrodes do not have to be provided for applying an electric field.

This time, it is the application of a photon flux 222 to this material which results in the deformation thereof within the plane of layer 220, which, in turn, results in the straining of the layer 10 assembled with the substrate 220 via molecular bonding.

The incident photon flux 222, coming from a radiation source not shown in the figure, can be directed through the layer 10 being strained, if the latter is transparent (the case of 10), or by the opposite face of the substrate 220 (beam 223; in which case a supporting substrate 220 made of a transparent photostrictive or semi-transparent material is used). This layer 10 can be obtained in one of the ways described above in connection with FIGS. 1A, 1B, 5-6, 8A-8C.

Among photostrictive materials, reference can be made to the ceramic PLZT (a composition already indicated above), or a PMN-PT type of crystal (a composition already indicated above), doped with tungsten, or of the lead-zirconium niobate and lead titanate type (PZN-PT).

The embodiment with a thin layer, which was already described above, remains valid for this type of material. The ranges of thicknesses are still valid: a thin layer such as this, or a set of thin layers, is, for example, of a thickness less than 200 μm or between 1 μm and 100 μm.

One straining method with a straining system containing a photostrictive material is identical or similar to one of those already described above.

In the three other examples mentioned above (electrostrictive or magnetostrictive or photostrictive material), there may be a successive application of strain, as already explained in the case of the piezoelectric material. Furthermore, the substrate can be initially pre-strained (application of a strain of the opposite sign of the strain to be applied to the layer being strained), while the pre-strain is then relaxed after assembly of layer 10 with the substrate.

In the case of a magnetostrictive or photostrictive material, a pre-strain of opposite sign can be applied, as in the case of the other materials.

For example, the application of a field or of photons makes the material contract. If a layer is bonded or assembled with a substrate or a layer of this material prior to the application of the strain, compression is produced. If bonding or assembly is carried out after straining, stress is produced during relaxation of the strain.

The invention claimed is:

1. A method of producing a strained layer on a substrate, the method comprising:
   a) assembling a layer with a first straining structure, the first straining structure comprising at least one substrate capable of being deformed within a plane thereof under the influence of an electric or magnetic field or a photon flux,
   b) straining the substrate by modifying the electric or magnetic field or the photon flux applied to at least one substrate to form the strained layer,
   c) assembling the strained layer with a transfer substrate, and
   d) removing all or part of the first straining structure to transfer the strained layer from the first straining structure to the transfer substrate.

2. The method according to claim 1, wherein assembling the layer with the first straining structure comprises assembling the first straining structure with a substrate, and thinning the substrate.

3. The method according to claim 2, wherein thinning the substrate comprises mechanical thinning, or fracturing the substrate along an embrittlement region, or mechanically and chemically thinning the substrate to a stop layer.

4. The method according to claim 2, wherein the substrate comprises an SOI-type substrate.

5. The method according to claim 1 further comprising:
   prior to step a), pre-straining, via straining of the first straining structure, with a prestrain having an opposite sign of that to be applied to the layer to be strained,
   after step a), relaxation of the pre-strain, in order to strain the layer to be strained.

6. The method according to claim 1, wherein at least one of assembling the layer with the first straining structure and assembling the strained layer with a transfer substrate comprises molecular bonding.

7. The method according to claim 1, wherein assembling the layer with the first straining structure comprises forming a first bond and assembling the strained layer with the transfer substrate comprises forming a second bond, and wherein the first bond is weaker than the second bond.

8. The method according to claim 1, wherein the transfer substrate further comprises an oxide surface layer.

9. The method according to claim 1, wherein the transfer substrate comprises silicon having a silicon oxide surface layer thereon, and wherein the layer comprises silicon.

10. The method according to claim 1 further comprising:
    e) transferring the strained layer from the transfer substrate towards to the first straining structure or to a second straining structure,
    f) additionally straining the strained layer via the first straining structure or via the second straining structure.

11. The method according to claim 1, wherein the transfer substrate comprises a second straining structure, the method further comprising additionally straining the strained layer using the second straining structure.

12. The method according to claim 10 or claim 11, wherein the second straining structure comprises at least one second substrate or a second layer capable of being deformed within a plane thereof under the influence of an electric or magnetic field or a photon flux, the additional straining comprising the straining of the strained layer by modifying the electric or magnetic field or the photon flux applied to the at least one second substrate or the second layer.

13. The method according to claim 1, wherein the first straining structure comprises a piezoelectric or electrostrictive or magnetostrictive or photostrictive material, having a thickness greater than 200 μm or between 200 μm and 500 μm or 1 mm or having a thickness of between 1 μm and 50 μm or 200 μm.

14. The method according to claim 1, further comprising forming an intermediate layer on an electrode on the at least one substrate or the layer, the intermediate layer comprising $SiO_2$, Ge, $Si_3N_4$, or $HFO_2$.

15. The method of claim 14, wherein the intermediate layer has a roughness on a face thereof which is assembled with the layer.

16. The method according to claim 1, wherein the layer comprises a semiconductor material.

17. The method according to claim 1, wherein the first straining structure comprises a piezoelectric material and associated electrodes arranged on both sides of the piezoelectric material.

18. The method of claim 17, wherein the piezoelectric material comprises one of berlinite (AlPO4), zinc oxide (ZnO), quartz, topaz, gallium phosphate (crystal GaPO4), langasite (La3Ga5SiO14), barium titanate (crystal BaTiO3), or lead titanate (PbTiO3), or lead zirconate titanate (Pb(ZrTi)O3) (PZT), or potassium niobate (KNbO3), or lithium niobate(LiNbO3), or lithium tantalate (LiTaO3), or sodium tungstate (NaxWO3), or Ba2NaNb5O5, or Pb2KNb5O15.

19. The method according to claim 1, wherein the straining structure comprises an electrostrictive material and associated electrodes arranged on both sides of the electrostrictive material.

20. The method of claim 19, wherein the electrostrictive material comprises compounds of lead-magnesium niobate (PMN),
compounds of lead-magnesium and lead titanate (PMN-PT), or
compounds of lead-magnesium-zirconium titanate (PLZT).

21. The method according to claim 1, wherein the straining structure comprises a magnetostrictive material.

22. The method of claim 21, wherein the magnetostrictive material comprises cobalt or TerFeNol-D of formula $Tb_xDy_{1-x}Fe_2$.

23. The method according to claim 1, wherein the straining structure comprises a photostrictive material.

24. The method of claim 23, wherein the photostrictive comprise a PLZT-type ceramic comprising compounds of lead-magnesium-zirconium titanate, or a crystal of PMN-PT comprising compounds of lead-magnesium niobate and lead titanate doped with tungsten, or lead-zirconium niobate and lead titanate (PZN-PT).

* * * * *